United States Patent
Riedel et al.

(10) Patent No.: US 9,595,785 B2
(45) Date of Patent: Mar. 14, 2017

(54) PROTECTIVE ELEMENT FOR CONDUCTORS

(71) Applicant: NEXANS, Paris (FR)

(72) Inventors: Richard Riedel, Flob (DE); Dietmar Volkl, Plossberg (DE); Norbert Bock, Kemnath (DE); Johannes Wagner, Flob (DE)

(73) Assignee: NEXANS, Paris (FR)

( * ) Notice: Subject to any disclaimer, the term of this patent is extended or adjusted under 35 U.S.C. 154(b) by 1097 days.

(21) Appl. No.: 13/740,593

(22) Filed: Jan. 14, 2013

(65) Prior Publication Data

US 2014/0030908 A1   Jan. 30, 2014

(30) Foreign Application Priority Data

Jan. 17, 2012  (EP) .................................... 12305061

(51) Int. Cl.
| | | |
|---|---|---|
| *B23Q 1/03* | (2006.01) | |
| *H01R 13/58* | (2006.01) | |
| *H01R 12/62* | (2011.01) | |
| *H01R 43/02* | (2006.01) | |
| *H05K 3/32* | (2006.01) | |
| *H01R 4/02* | (2006.01) | |
| *H01R 12/59* | (2011.01) | |

(52) U.S. Cl.
CPC ............. *H01R 13/58* (2013.01); *H01R 4/027* (2013.01); *H01R 12/62* (2013.01); *H01R 43/0256* (2013.01); *H05K 3/32* (2013.01); *H01R 4/023* (2013.01); *H01R 12/592* (2013.01); *Y10T 29/49147* (2015.01)

(58) Field of Classification Search
CPC ..... B23Q 15/26; B23Q 15/013; B23Q 9/0085
See application file for complete search history.

(56) References Cited

U.S. PATENT DOCUMENTS

| | | | |
|---|---|---|---|
| 5,049,090 A | | 9/1991 | Johnson |
| 5,320,007 A | * | 6/1994 | Weirauch ............... B23Q 3/103 269/900 |
| 5,772,467 A | | 6/1998 | Burgess |
| 5,941,700 A | * | 8/1999 | Fuchs .................... A61C 13/20 269/266 |
| 5,954,461 A | * | 9/1999 | Lemieux ............... B23B 47/288 408/115 R |

(Continued)

*Primary Examiner* — Lee D Wilson
(74) *Attorney, Agent, or Firm* — Sofer & Haroun, LLP

(57) ABSTRACT

A protective element for manufacturing circuit boards is provided, where conductors are fastened to the contacts of the conductors. The protective element includes recesses which are configured for arranging a conductor each, and the protective element can be arranged adjacent a support. The recesses of the protective element are arranged in a first position in alignment with the recesses of the support and in a second position at an angle relative to the recesses of the support. Preferably, the protective element has at least one hinge section which is configured for interacting with a complimentary hinge section of a support which can be mounted against the protective element, where pivoting of the protective element against the support about the pivoting axis of the interacting hinge sections moves the protective element on the support from the first position into the second position.

3 Claims, 5 Drawing Sheets

(56) References Cited

U.S. PATENT DOCUMENTS

| | | | |
|---|---|---|---|
| 6,283,685 B1* | 9/2001 | Lemieux | B23B 47/288 408/115 R |
| 6,386,905 B1 | 5/2002 | Ito | |
| 6,394,712 B1* | 5/2002 | Weinstein | B23B 47/287 408/103 |
| 6,481,937 B1* | 11/2002 | Sommerfeld | B23B 47/287 408/103 |
| 2014/0030908 A1* | 1/2014 | Riedel | H01R 4/027 439/460 |

* cited by examiner

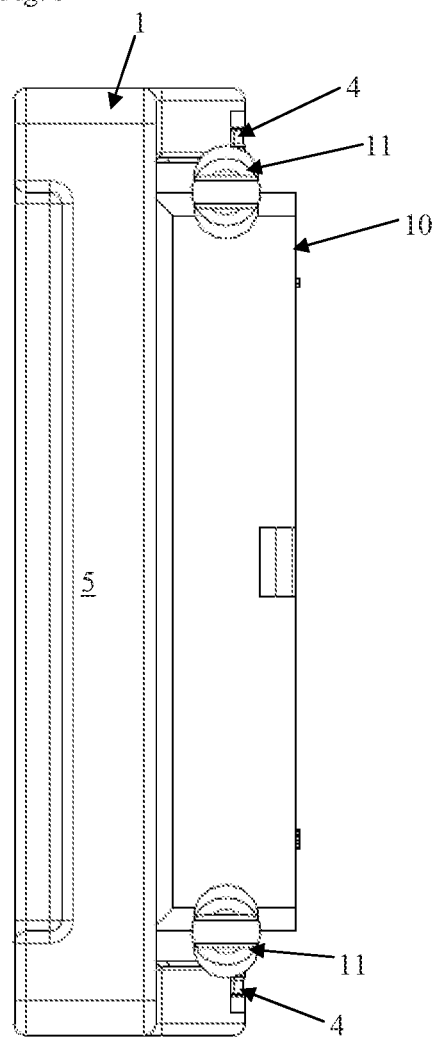
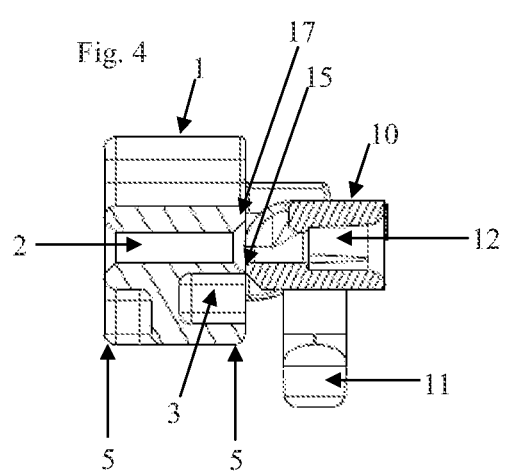

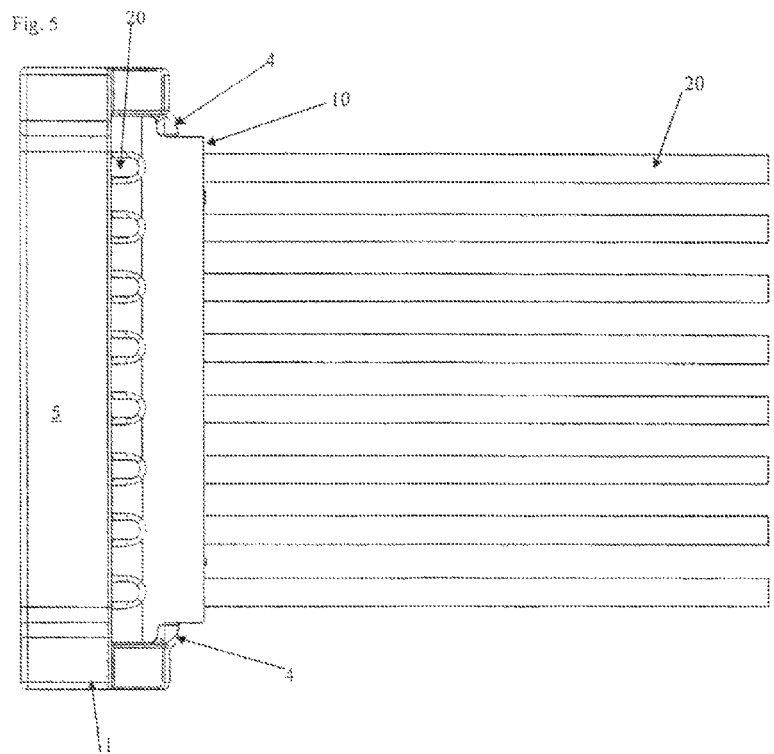
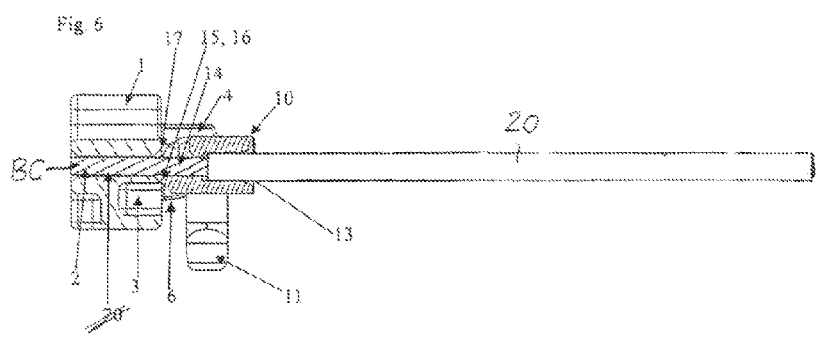

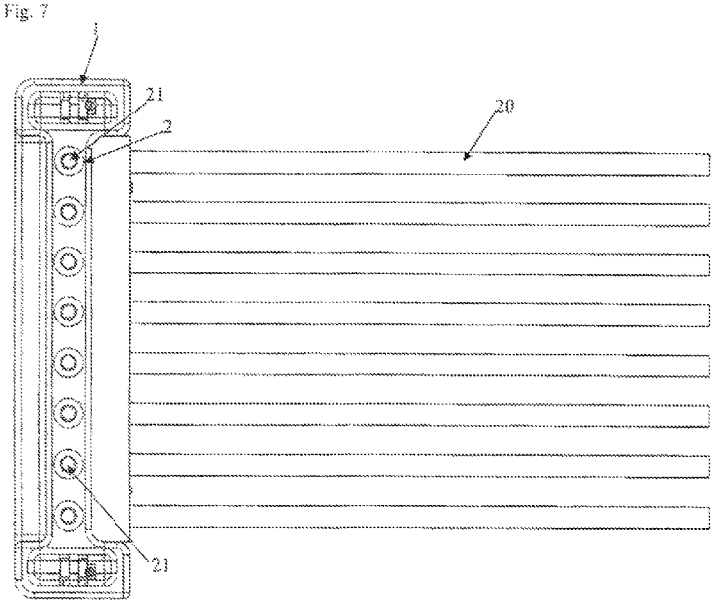
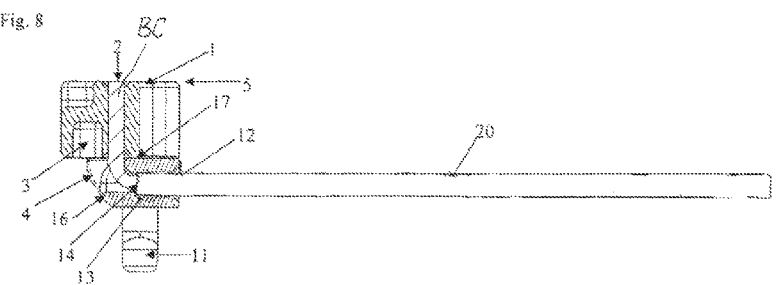

PROTECTIVE ELEMENT FOR CONDUCTORS

RELATED APPLICATION

This application claims the benefit of priority from European Patent Application No. 12 305 061.9, filed on Jan. 17, 2012, the entirety of which is incorporated by reference.

BACKGROUND

Field of the Invention

The present invention relates to a protective element for conductors, wherein the protective elements are arranged in a support which can be fastened to a circuit board and is connected to contacts, which are secured to the circuit board; the invention also relates to the use of the protective element in the manufacture of a circuit board with conductors secured to the contacts; and to a method for producing the connection between the conductors and the contacts of a circuit board.

The protective element is distinguished by the fact that it is configured to interact with a support in whose recesses conductors can be arranged or are arranged, and the protective element is configured for guiding the conductors during the arrangement of the support on the circuit board in a predetermined position in which they are arranged so as to be adjacent the contacts and, optionally, after removing the protective element from the conductor ends, can be connected to the contacts. The conductors are preferably electrically connected by means of welding, soldering, crimping, or clamping to a contact each.

Description of the Related Art

For manufacturing a connection of conductors with contacts of a circuit board, the conductors are pushed into recesses of a support, are positioned parallel to the contacts, while the support is locked to the circuit board, and are subsequently welded to the contacts.

OBJECTS AND SUMMARY

Therefore, it is the object of the invention to make available a device and a method for improving the production of the contact between conductors which protrude above recesses of a support with contacts of a circuit board, particularly the alignment of the sections of the conductors which protrude above the supports relative to the contacts fastened to the circuit board.

In accordance with the invention, the above objects are met by the features of the Claims and particularly by a protective element for use in a method for manufacturing circuit boards to whose contacts conductors are fastened. The protective element has recesses which are configured for a conductor each, wherein the protective element can be arranged adjacent a support and, particularly, the recesses of the protective element are arranged in a first position in alignment with the recesses of the support, and are arranged in a second position at an angle relative to the recesses of the support. Preferably, the protective element has at least one hinge section configured for interacting with a corresponding hinge section of a support arranged against the protective element, wherein pivoting of the protective element, relative to the support about the pivot axis of the interacting hinge sections, moves the protective element at the support from the first position into the second position. Preferably, at least two recesses of the protective element, preferably all recesses of the protective element which are intended for receiving conductors, are arranged in a plane which extends parallel to the hinge section or parallel to the pivot axis of the hinge from the hinge sections of the protective element and the carrier.

Preferably, the protective element has a first stop which is configured to limit pivoting of the protective element when contacted by the support into the first position, and a second stop which is configured for contacting the support after pivoting of the protective element into the second position. In this manner, the first and second stops limit pivoting of the protective element relative to the support into the first or into the second position. Optionally, the support may have a first stop located opposite the first stop of the protective element and a second stop located opposite the second stop of the protective element, wherein the stops are configured for being contacted when pivoting from the first or second stop of the protective element, respectively.

The protective element can be present in combination with a support, wherein the hinge sections of the protective elements contact the hinge sections of the support and is positionable into a first position relative to the support in which the recesses of the protective element are arranged flush with the recesses of the support, wherein preferably a first stop of the protective element is arranged against a first stop of the support. The pivot axis of the hinge is preferably arranged parallel to the plane in which at least two recesses of the protective element and/or at least two recesses of the support are arranged into which recesses a conductor each is to be arranged. In a second position, which is assumed by pivoting the protective element against the support about the pivot axis, the recesses of the protective element are arranged at an angle relative to the recesses of the support, for example, at an angle of 70-120°, preferably an angle of 90°. Preferably, in the second position, a second stop of the protective element rests against a second stop of the support in order to limit pivoting to this angle.

The method according to the invention for manufacturing a circuit board with whose contacts the conductors are connected is preferably carried out with the use of the protective element. The conductors are arranged in recesses of a support which can be fastened to the circuit board, particularly can be locked to the circuit board, wherein the protective element is arranged adjacent to the support, and wherein the recesses of the protective element are arranged for receiving the conductors in alignment with the recesses of the support, and the conductors are arranged by the aligned recesses. Preferably the protective element has a first stop which is placed against the support in order to limit pivoting of the protective element in a direction toward the arrangement of the recesses in a common plane.

The support is arranged on the circuit board, particularly locked on to the circuit board, wherein, after or preferably prior to arranging the support on the circuit board, the protective element is pivoted from the first into the second position in which the plane in which the recesses of the protective element are arranged at an angle relative to the plane in which the recesses of the support are located, particularly an angle of 70-120°, particularly 90°. In so doing, the conductor is bent by the pivoting angle.

Preferably a second stop of the protective element when being pivoted into the second position is arranged against a second stop of the support, which limits pivoting to the angle.

Optionally, in the area in which the protective element arranged on the support is arranged at the circuit board, the circuit board has at least one projection, preferably two projections, which contact the protective element which has been pivoted into the second position and space the protective element from the support when the support is arranged on the circuit board, so that the protective element is separated from the support. In this manner, the projection of the circuit board biases the protective element away from the support, spaces the protective element from the support, and pushes the protective element at least over sections thereof from the conductors and exposes the conductors at least over sections, preferably completely.

Particularly preferred, the projections are contacts which protrude beyond the circuit board, particularly contacts arranged approximately perpendicularly to the circuit board.

In accordance with a preferred embodiment, in the area which in the first position faces the support, the protective element has a positioning recess into which may project the projection which, in particular, is a contact arranged perpendicularly on the circuit board. Preferably, the positioning recess or the longitudinal center axis of the positioning recess is arranged parallel to the recesses of the protective element. When the positioning recess is arranged parallel to the recesses of the protective element, the conductors arranged in the recesses are aligned parallel to the contacts when the positioning recess is mounted. Moreover, a positioning recess of the protective element for receiving a projection protruding beyond the circuit board, which particularly is a contact protruding beyond the circuit board, and particularly consists of the contacts to which the conductors are connected, forms a positioning aid for positioning the protective element over the projection and for aligning and arranging the support arranged at the protective element, and the conductors guided by the support and the protective element.

As an alternative to a projection on the circuit board facing the support, or its positioning recess, the protective element may have an attachment which, when the protective element is pivoted into the second position, protrudes beyond the support on that side which is located opposite the protective element. Such an attachment of the protective element preferably protrudes beyond the plane of the surface by means of which the support is placed against the circuit board, so that, when the support approaches the circuit board, the attachment impinges against the circuit board and the protective element is biased away from the support and is spaced apart from the support. A positioning recess which can be arranged around a projection of a circuit board and/or an attachment which projects beyond the protective element (1) on that side, which faces a circuit board (30), serve the purpose of spacing the circuit board (30) from the circuit board (30) and from the support (10) when the protective element (1) is being mounted.

The support preferably has a locking device for locking with the circuit board on its first side which is located opposite its second side, wherein the protective element protrudes in its second position beyond the second side of the support. When mounting the support with its first side on the circuit board, particularly by locking with the circuit board, the protective element projects in its second position beyond the second side of the support and the circuit board, wherein the recesses of the protective element are arranged at an angle, particularly preferred of 90° relative to the recesses of the support and/or the circuit board, so that conductors guided in the recesses of the protective element protrude beyond the circuit board at this angle and are arranged, when the support is mounted in the vicinity or adjacent to the contacts protruding beyond the circuit board. Preferably the recesses of the protective element and the respective conductors arranged therein are arranged parallel to the contacts of the circuit board.

Particularly preferred, the support has a stop, which can also be called a third stop, whose arrangement against a contact protruding beyond the circuit board leads in the second position of the protective element, or after spacing the protective element from the support for mounting the conductors protruding from the support, to the arrangement of the conductors which protrude out of the support in which the conductors extend over at least sections parallel to a contact. In this manner, such a stop of the support additionally serves for positioning the support and of the contact of the circuit board and of the conductors guided in the support adjacent the contacts of the circuit board and/or for positioning of the support into the position suitable for locking with the circuit board. This stop of the support may be the same as the first stop of the support, for example, an end face of the support which defines a recess in which a conductor is guided.

The protective element according to the invention has the advantage that during the process of manufacturing the ends protruding beyond the support are guided by the recesses of the protective element so that the sections or ends of the conductors, which are electrically connected to the contacts of the circuit boards, are protected against bending from the position in which they are arranged at least over sections thereof parallel to the conductor.

In particular, in the embodiment in which the protective element is in contact by means of a hinge portion with a hinge portion of the support, particularly in engagement with a hinge portion of the support, the protective element has the advantage that pivoting about the hinge from the first into the second position, all conductors which are arranged continuously in the recesses of the support and the protective element, are bent into a position relative to the recesses of the support predetermined by the second stop. This guidance of the protective element at the support by the hinge results in a parallel bending of all conductors arranged in the recesses of the support due to the fact that the pivot axis of the hinge extends parallel to the plane in which at least two recesses of the protective element, preferably all recesses of the protective element, are arranged for receiving conductors.

The arrangement of the protective element adjacent the support, wherein conductors are arranged in the recesses by the support and the protective element, produces a fixed connection of the protective element adjacent the support which is sufficiently durable for the assembly and is reversible, so that in particular a simple manipulation of the protective element positioned in the second position takes place without impairing the arrangement and alignment of the conductors. In particular, the protective element makes possible a manufacturing method in which, prior to the arrangement of the support at the circuit board and prior to subsequently connecting the conductors to the contacts of the circuit board, the conductors having the support arranged at the end and the protective element arranged at the support, which is positioned in the second position against the support, and passing the conductors through an opening, particularly a housing opening. Correspondingly, the manufacturing method may include the step of moving at least one conductor with a protective element arranged at the end thereof and a support arranged on the protective element through an opening of an housing, wherein each conductor is guided by a recess of the support and a recess of the protective element which is pivoted into the second position against the support, and subsequently arranging the support on the circuit board and connecting the conductor to a contact arranged on the circuit board. Preferably, the method includes spacing the protective element away from the support, for example, by arranging the protective element against a projection of the circuit board, wherein the projection is particularly a contact, or by arranging a projection of the protective element against the circuit board, wherein the protective element is pivoted into the second position relative to the support. In an alternative embodiment, the protective element can remain arranged at the support by means of the hinge sections arranged against each other and have, for example, breakthroughs in which a device for connecting a conductor to a contact can be placed.

Optionally, the protective element may have breakthroughs which permit a placement of a device for connecting a conductor to a contact, for example, two oppositely located breakthroughs in the wall of a recess of the protective element through which, for example, an electrode each of a pair of welding electrodes can be placed, which are part of the device for connection. In this embodiment, the protective element remains arranged at the conductors and forms a component of the product manufactured by the method. In this connection, the protective element may optionally contact the support, for example, the hinge sections of the protective element may be in contact with the hinge sections of the support, or the protective element can be spaced by a distance from the support, for example, by a distance which is shorter than the section of the conductor which is surrounded by the recesses of the element.

The conductors may be, for example, solid conductors, compact strand conductors and/or conductors surrounded by a sleeve, particularly conductors compressed together with a sleeve or conductors reinforced with solder.

BRIEF DESCRIPTION OF THE DRAWINGS

The invention will now be described in more detail with respect to the Figures which schematically show in FIG. 1, a top view of a protective element, in FIG. 2, a protective element according to FIG. 1 in a sectional view, in FIG. 3, a protective element, in a top view, with a support arranged on the protective element, in FIG. 4, a protective element arranged on a support, in a sectional view, in FIG. 5, a protective element with conductors mounted on a support, in a top view, in FIG. 6, a protective element with conductor mounted on a support, in accordance with FIG. 5, in a sectional view, in FIG. 7, a protective element arranged on a support, in the second position, in a top view, and in FIG. 8, a protective element with conductor mounted on a support, pivoted into the second position, according to FIG. 7, in a sectional view, in FIG. 9, a protective element with conductor with a conductor pivoted into the second position prior to locking of the support to a circuit board, in a sectional view, and in FIG. 10, a protective element with conductor spaced from the support, when locking the support to the circuit board, in a sectional view.

DETAILED DESCRIPTION OF THE INVENTION

In the Figures, equal reference numbers refer to functionally equal elements.

Figure 1:
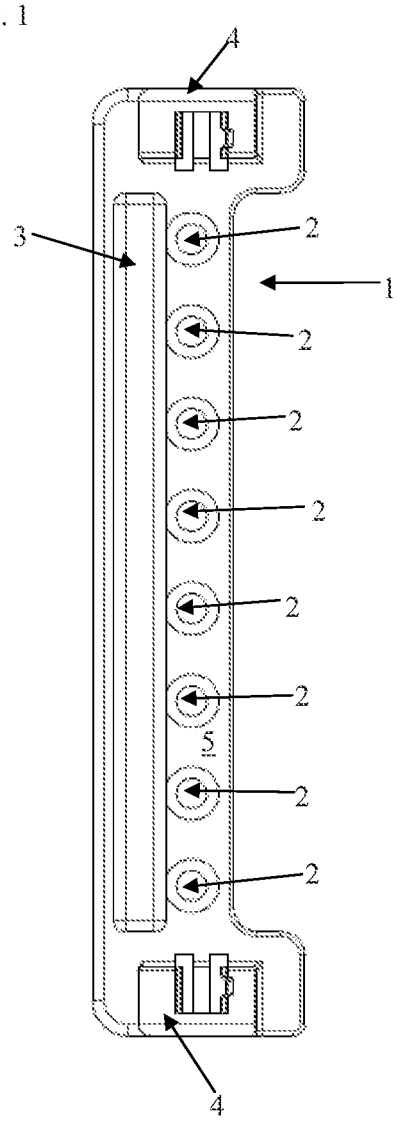

FIG. 1 shows in a top view of a protective element 1 eight recesses 2 which, in accordance with the generally preferred embodiment, are located in a common plane and extend parallel to each other. The protective element 1 has a positioning recess 3 which is arranged against a projection of a circuit board. In accordance with the generally preferred embodiment, the projection consists of contacts which protrude beyond the circuit board. The protective element 1 has two spaced apart hinge sections 4 which form a hinge with complimentary hinge sections of a support, wherein the pivot axis of the hinge extends parallel to the plane in which the recesses 2 for receiving individual conductors 20 are arranged.

Figure 2:
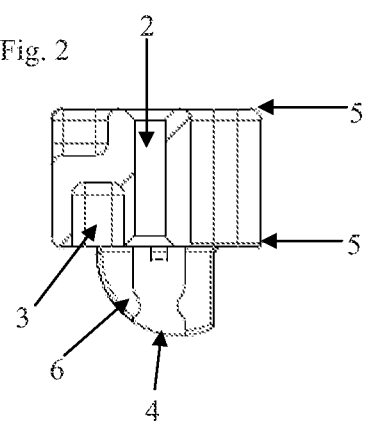

As can be seen from FIG. 2, which shows a sectional view of a protective element 1 according to FIG. 1, the protective element 1 can be defined by two surfaces in parallel planes 5 or can extend between two parallel planes 5. The recesses 2 which preferably extend completely through the protective element 1 and are open to both planes 5 are arranged preferably parallel to the positioning recess 3. The hinge section 4 can optionally protrude beyond a plane 5 of the protective element. The hinge section 4 may have, for example, a guide surface 6 which is movable in an arc against a complimentary guide surface of a support 10 and forms a guide for pivoting the protective element 1 against the support 10.

FIG. 3 shows in a top view a protective element 1 which is arranged on a support 10 and is positioned in the first position. The protective element 1 is pivotable in a guided manner on the support 10, because its hinge section 4 is arranged against a complimentary hinge section of the support 10. The support 10 has two locking elements 11 by means of which the support 10 can be locked to complimentary locking elements 33 of a circuit board 30. In the present case, a reversibly deformable element is shown as the locking element 11 of the support 10 which is lockable to a locking element 33 as the complimentary counter piece which is fastened on the circuit board 30, for example, a bore.

FIG. 4 shows a sectional view of a protective element 1 and a support 10 of FIG. 3 in the first position in which the recesses 2 of the protective element 1 are arranged flush in alignment with a respective recess 12 of the support 10. The first stop 15 of the protective element 1 rests against the support 10 and limits the pivoting movement of the protective element 1 against the support 10 into the first position. The second stop 17 limits the pivoting movement of the protective element 1 in the second position by contacting the support 10.

FIG. 5 shows in a top view that a conductor 2 can be arranged in a recess 2 of the support which is guided through a recess 12 of a support 10. As a result of the parallel arrangement of the recesses 12 in the support 10 in a common plane and the parallel arrangement of the recesses 2 of the protective element 1, the conductors 20 are arranged in a common plane and parallel to each other or in straight lines in a first position illustrated here in which the recesses 2, 12 of the protective element 1 and the support 10 are aligned. Preferably, the recess 12 of the support 10 has a first section 13 with a diameter which corresponds at least to the external diameter of the circumferential insulation of a conductor 20, and an adjacent section 14 with a smaller diameter which only receives the conductor 20 from which the insulation has been removed. As a result, a narrowing of the recess 12 of the support 10 is formed between the first section 13 and the second section 14, wherein the end face of the insulation of the conductor 20 can impinge, while only the end section of the conductor 20 from which the insulation has been removed can be arranged through the second section 14 into the recess 20 of the protective element 1.

FIG. 6 shows a sectional view of a protective element 1 which, in accordance with FIG. 5, is positioned in the first position on a support 10, while a conductor 20 is moved through the recess 12 of the support 10 and the recess 2 of the protective element 1 arranged in alignment therewith.

FIG. 7 shows in a top view the protective element 1 pivoted into the second position, in the present case, at about 90° relative to the first position. Correspondingly, the conductors 20 are bent from the plane in which the recesses 12 of the support 10 are arranged into the second position of the recesses 2 of the protective element 1 which has been pivoted by 90°. Correspondingly, the top view of FIG. 7 shows the end faces 21 of the conductors 20 with the recesses 2 of the protective element 1.

FIG. 8 shows in a sectional view the protective element 1 on the support 10 which has been pivoted into the second position, wherein the conductor 20 is bent by the pivoting of the protective element 1 against the plane of the recesses 12 of the support 10. In this view, it becomes apparent that the conductor 20 is arranged parallel to the positioning recess 3 as a result of the preferred parallel arrangement of the recesses 2 of the protective element 1 and the positioning parallel to the positioning recess 3. The second stop 17 rests against the support 10 and limits the pivoting movement of the protective element 1 up to the second position. A portion of the end face of the support, for example in the area which surrounds its recesses 12, may form a third stop 16 which impinges against the contact 31 when the support 10 is connected to the protective element 1.

Figure 9:
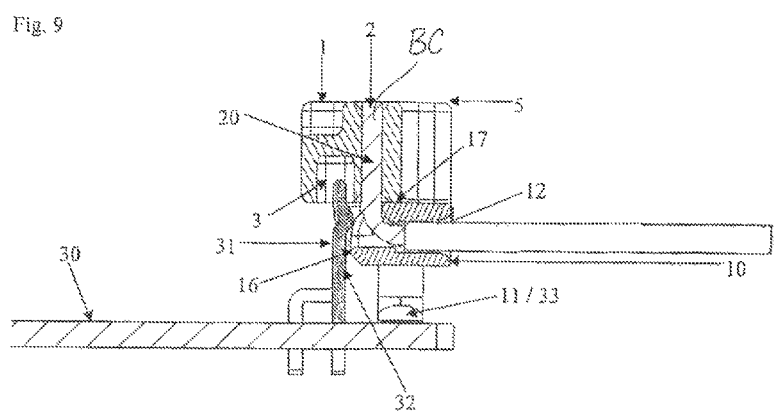

FIG. 9 shows, for the manufacturing method, a first partial step of the arrangement of the protective element 1 pivoted into the second position relative to the support 10 in the direction of a circuit board 30, which is protruded by an approximately perpendicularly arranged contact 31. Corresponding to the generally preferred embodiment, the protective element 1 is mounted with its positioning recess 3 against the contact 31 which forms a projection on the circuit board, and the support 10 has a third stop 16 which impinges against the connecting surface 32 of the contact 31, to which the parallel section of the conductor 20 is connected. In the position shown in FIG. 9, the support 10 is still spaced from the locking element 33 of the circuit board 30. When the support 10 is moved against the circuit board, or its locking element 33, the support 10 is locked to the circuit board 30. When the protective element 1 connected to the support 10 is moved against the contact 31, the protective element 1 is biased away and spaced apart from the support 10. Since the section of the conductor 20 which is arranged in the recess 2 of the protective element 1 extends parallel to the direction of movement of the protective element 1 from the support 10 and parallel to the longitudinal middle axis of the positioning device 3, the protective element 1 slides from the end section of the conductor 20.

Optionally, the positioning recess 3 can generally be constructed such that the length of the contact 31, which protrudes beyond the circuit board 30, spaces the protective element 1 by the distance from the support 10, which is equal to the length of the conductor 20 in the recess 2 of the protective element 1, in order to completely remove the protective element 1 from the conductor 20.

Figure 10:
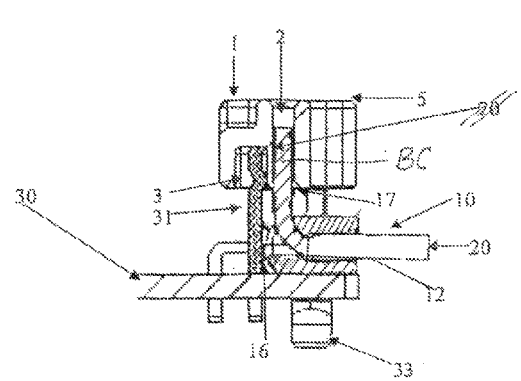

FIG. 10 shows that the protective element 1 is suitable for positioning the end section of the conductor 20 in a guided manner to a contact 31 which protrudes beyond a circuit board 30 and for protecting against mechanical loads. In this manner, a suitable position is ensured for a later connection of the conductor 20 to the contact 31.

Preferably, following the spacing of the protective element 1 from the support 10 as illustrated in FIG. 10, the protective element 1 is completely removed from the conductor 20 and the conductor 20 is connected to the contact 31, for example, by welding.

LIST OF REFERENCE NUMERALS

1 Protective element
2 Recess of protective element
3 Positioning recess
4 Hinge section
5 Plane
6 Guide surface
10 Support
11 Locking element
12 Recesses of support
13 First section
14 Second section
15 First stop
16 Third stop
17 Second stop
20 Conductor
21 End face
30 Circuit board
31 Contact
32 Connecting surface
33 Locking element of circuit board

The invention claimed is:

1. A Protective element for electrical conductors comprising:
   recesses for receiving individual conductors; and
   a hinge section which is configured to form, together with a hinge section of a support, a hinge which has a pivoting axis which extends parallel to the plane in which the recesses of the protective element are arranged, wherein the protective element has a stop which limits pivoting of the protective element about the pivoting axis against the support into a first position in which the recesses of the protective element are aligned flush with recesses of the support, and
   wherein the protective element has a second stop which is configured to limit pivoting of the protective element against the support in a second position, in which the recesses of the protective element are pivoted at an angle of 70 to 120° against the recesses of the support.

2. The Protective element according to claim 1, wherein the at least one hinge section of the protective element is placed against a complimentary hinge section of the support, and the support has recesses arranged in a plane extending parallel to the pivoting axis of the hinge formed by the hinge sections, for receiving the individual conductors.

3. The Protective element according to claim 1, wherein the protective element has a positioning recess whose longitudinal axis extends parallel to the longitudinal axis of the recesses of the protective element and which can be arranged around a projection of a platine and/or has at least one attachment piece which protrudes beyond the protective element at the side which faces a platine for spacing the protective element during mounting against the platine away from the platine and the support.

* * * * *